United States Patent [19]

Craft

[11] 3,911,472

[45] Oct. 7, 1975

[54] ISOLATED CONTACT

[75] Inventor: Michael E. Craft, Scottsdale, Ariz.

[73] Assignee: Motorola, Inc., Chicago, Ill.

[22] Filed: Dec. 26, 1973

[21] Appl. No.: 430,459

Related U.S. Application Data

[63] Continuation of Ser. No. 138,219, April 28, 1971, abandoned.

[52] U.S. Cl. ........................ 357/51; 357/88; 357/89; 357/68

[51] Int. Cl.[2] ..................... H01L 27/02; H01L 23/48

[58] Field of Search ........ 317/234, 235, 48.1, 40.13

[56] References Cited

UNITED STATES PATENTS

| | | | |
|---|---|---|---|
| 3,427,513 | 2/1969 | Hilbiber | 317/234 |
| 3,615,932 | 10/1971 | Makimoto et al. | 317/234 |

OTHER PUBLICATIONS

Def. Pub., Ser. No. 769,261, Lin, October 1968.

*Primary Examiner*—John S. Heyman
*Assistant Examiner*—E. Wojciechowicz
*Attorney, Agent, or Firm*—Vincent J. Rauner; Henry T. Olsen; Willis E. Higgins

[57] ABSTRACT

A transistor having an emitter and base with contact surfaces lying substantially in the same plane has an increased safe operating area, that is increased wattage rating without increasing the size of the transistor, achieved by providing an isolated base contact of an enhanced conductivity immediately adjacent the emitter, thereby providing a distributed resistance between the termination of the enhanced conductivity isolated base contact and the base ohmic contact of the transistor.

10 Claims, 9 Drawing Figures

INVENTOR.
*Michael Edward Craft*
BY *Mueller & Aichele*
ATTY'S.

INVENTOR
Michael Edward Craft
BY
Mueller & Aichele
ATTY'S.

INVENTOR
Michael Edward Craft
BY Mueller & Aichele
ATTY'S.

ISOLATED CONTACT

This is a continuation of application Ser. No. 138,219, filed Apr. 28, 1971, now abandoned.

BACKGROUND OF THE INVENTION

This invention relates to transistors wherein the emitter and the base have contact surfaces lying in the same plane having an increased safe operating area for the same size of transistor and it is an object of the invention to provide an improved transistor of this nature.

It is an ever present problem in the making of transistors to make them smaller and to increase the power of wattage output thereof. While perhaps leaving the size of the transistor the same it is a problem to increase the wattage that may be obtained therefrom.

The basic problem is one of economics involving the dimensions of the semiconductor chip, silicon for example. If the area of the silicon chip is large the cost is greater and thus the effort, constantly, is to reduce the amount of silicon used. It is of course always possible to make a transistor large enough to develop the power required but this is quite uneconomical unless the size of the transistor is reduced as much as it can be. The limit of the wattage that may be obtained from a transistor for a particular value or range of values of emitter to collector voltage may be defined as the safe operating area inasmuch as an attempt to obtain wattages above such a value results in secondary breakdown of the transistor. According to the invention, the safe operating area may be substantially increased, which is to say for the same emitter to collector voltage the wattage obtainable is substantially increased. To put it differently, if the output wattage is to remain the same for a particular emitter to collector voltage, the area of the transistor can be substantially reduced. It is a further object of the invention to provide a transistor having achieved the beneficial results indicated.

It is a further object of the invention to achieve increased power output of transistors in an improved manner, or with the same power output to decrease the size thereof, without sacrificing other desirable features of the transistors.

It is a further object of the invention to provide an improved transistor of the nature indicated which is simple in form, efficient in operation and economical to manufacture.

It is a further object of the invention to provide an improved method of forming a transistor, or diode, having an increased safe operating area at increased wattage outputs.

SUMMARY OF THE INVENTION

In carrying out the invention according to one form there is provided a transistor having an emitter of one conductivity type, a base of the opposite conductivity type surrounding said emitter, and forming a junction therewith. The emitter and base have contact surfaces lying in the same plane and the junction therebetween extends to the surface. The transistor includes a collector of the same conductivity type as the emitter. Ohmic contact metallizations are formed on the emitter and the base and an isolation, or insulating, layer extends over the base emitter junction between the ohmic contact metallizations, and a distributed resistance is created in the base region on the base side of the emitter base junction. In effect an enhanced conductivity region is created immediately adjacent the periphery of the emitter thereby providing an isolated base contact. The invention has equal applicability to NPN transistors and PNP transistors and is applicable also to diode structures.

More specifically the distributed resistance is created by forming an enhanced conductivity region under the isolation layer immediately adjacent the periphery of the transmitter and terminating short of the base ohmic contact metallization.

DESCRIPTION OF THE PREFERRED EMBODIMENTS

Figure 1:
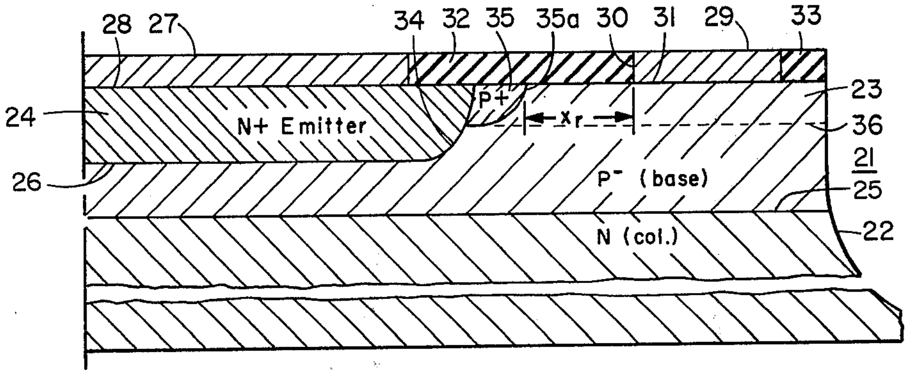
FIG. 1 is a sectional view, partially broken away, illustrating one form of transistor according to the invention.

Referring to FIG. 1 of the drawings there is shown a mesa type transistor 21 having an N collector 22, a P-base 23 an N+ emitter 24, a junction 25 between the base and collector and an emitter base junction 26. The collector 22 is shown broken in the interest of conserving space.

While shown as a mesa type structure it will be evident that the transistor 21 could be of some other form for example, planar.

An ohmic metal contact 27 is formed on the N+ emitter at the surface 28 and an ohmic metal contact 29 is formed on the P− base at the surface 31, the surfaces 28 and 31 lying essentially in the same plane. Between the metallizations 27 and 29 there is an insulating layer 32 for example of silicon dioxide, a portion 33 of the silicon dioxide layer extending to the right hand edge of the transistor as shown. The insulating layer 32 overlies that portion of the junction 26 adjacent the right hand edge 34, or peripheral junction portion of the emitter 24. Immediately adjacent the peripheral junction portion 34 there is a P+ region 35 between the right hand edge 35*a* of which and the left hand edge 30 of the base metal contact 29 is a region designated by $x_r$ which defines a distributed resistance extending between the right hand edge 35*a* of region 35 and the left hand edge 30 of the metallization 29.

The P+ region 35 adjacent the peripheral portion 34 of the emitter base junction serves to hold the minority carriers close to the emitter junction periphery, thereby reducing charge storage in this area. The P+ region 35 forms an isolated base contact and defines the area $x_r$ as distributed resistance. This improves the safe operating area of the transistor since the distributed resistance acts as a ballast to the injection of carriers across the emitter base junction and forces a more uniform carrier injection profile with reduced formation of localized current concentrations due to junction nonuniformities.

Utilizing the distributed resistance as indicated results in an increase in the safe operating area of transistors. Increases of about 30 percent or more, as compared with devices not having such a distributed resistance, have been obtained as will be more fully described.

In power transistors the emitter current is high and the base current also may be high. Since the distance from the center of the emitter base junction 26 to the edge 30 of the base contact 29 is larger than the distance from the periphery 34 to the edge 30, the resistance from the center of the emitter base junction is greater than the resistance from the periphery 34 to the edge 30. As is well known small base currents flowing through the larger resistance value tend to bias off a substantial portion of the emitter whereby the emitter current is concentrated at its peripheral junction 34. This phenomenon is referred to as base crowding. In conventional power transistors the base contact 35 which may be an enhancement diffusion may extend from the periphery 34 all the way to base contact 29 and there underneath as shown by dotted line 36. In this manner the P+ base enhancement diffusion provides a pathway for the increased base current in this area and permits the value of beta to remain high for large values of collector current.

As current and power requirements are increased for the same size of transistor area, a point is reached at which secondary failure takes place in conventional transistors. In this case, evidently the base current flowing from the peripheral junction 34 to the P+ contact diffusion 35 which, in conventional devices, extends all the way to the base contact 29 ultimately overheats portions of the transistor and perhaps even melts the same thereby destroying it.

According to the invention the P+ base enhancement region (diffusion) does not extend all the way to the base contact 29 (edge 30), but terminates short thereof thereby defining the region $x_r$ as a distributed resistance. The base enhancement region (diffusion) 35 may have a radial extent of about 1 mil greater than the radius of the emitter 24. The presence of $x_r$ as a resistance having base current flowing therethrough causes a voltage drop in this area and forces the base current to utilize additional area of the emitter base junction between the periphery 34 and the remainder of the emitter. That is to say, the area of the emitter base junction which supplies current to the base extends around from the P+ contact diffusion 35 to a substantial extent. In this manner a greater portion of the P− base as well is utilized whereby additional amounts of power are obtainable from a transistor of a given dimension. As indicated above, for some power transistors 30 percent additional wattage may be obtained without experiencing secondary breakdown of the device. Inasmuch as the distributed resistance $x_r$ forces the emitter base current to utilize additional portions of the emitter base junction it acts as a ballast.

Figure 9:
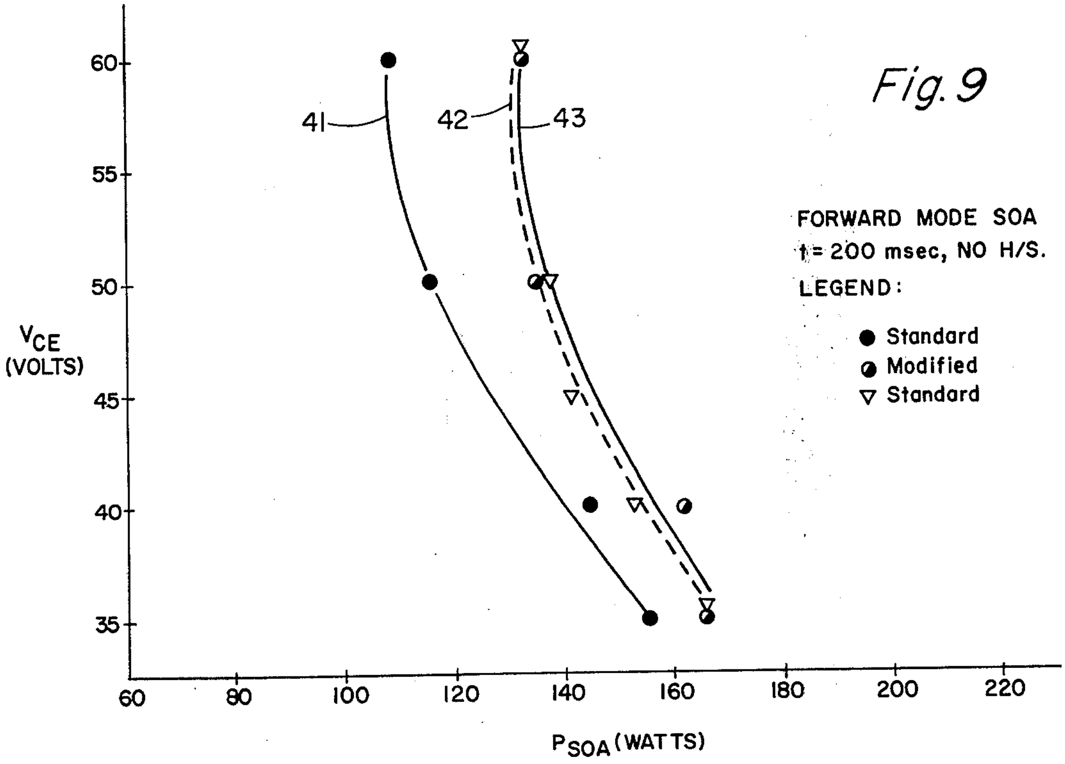
FIG. 9 is a series of graphs illustrating the improvement in safe operating area achieved by utilization of the apparatus and methods of the invention.

Referring to FIG. 9 there is shown a series of graphs 41, 42 and 43, 41 and 42 representing respectively a standard device and a device modified according to the invention. Curve 43 represents a standard device of substantially larger dimensions than that represented by curve 42.

In FIG. 9 the ordinate represents emitter collector voltage in volts and the abscissa represents the power in watts of safe operating area. The graphs are loci of fail points derived when a device fails at the delivered wattage and the voltage indicated, the on time being 200 milliseconds, and there being no separate provision of a heat sink. Curves 42 and 43 are sufficiently close together that they in effect overlie each other and curve 42 is shown dotted to distinguish it from curve 43. Curve 41 may, for example, apply to the device shown in FIG. 1 wherein the P+ base enhancement diffusion or base contact diffusion extends all the way from the emitter to the edge of the device as shown by the dotted line 36. Curve 42 represents the same device dimensionally and with respect to the other constants of the various layers but the base contact diffusion or base enhancement diffusion is isolated as shown by the P+ area 35 thereby providing the distributed resistance $x_r$ between the extremity 35*a* of diffusion 35 and the edge 30 of the base contact 29.

Thus, at 60 volts the standard device failed while delivering about 108 watts whereas the device according to the invention at 60 volts failed while delivering 132 watts, an increase of from 108 to 132, an increase of about 22 percent. The same type of device when operating at 35 volts failed at 155 watts in the case of the standard device and 165 watts in the case of the device according to the invention, an increase of about 6.5 percent. As may be seen from the graphs they tend to converge between the values at 60 volts and 35 volts.

The device corresponding to curve 43 has an area about 30 percent greater than that corresponding to curve 42 and yet has the same locus of safe operating area. Thus the percentage improvement in wattage may be viewed as an increase in power attainable from a device of the same dimensions or the device may be reduced in dimensions by that percentage while still delivering the same wattage. From either point of view there is a substantial percentage of saving of material involved, or an increase in wattage capacity.

Figure 8:
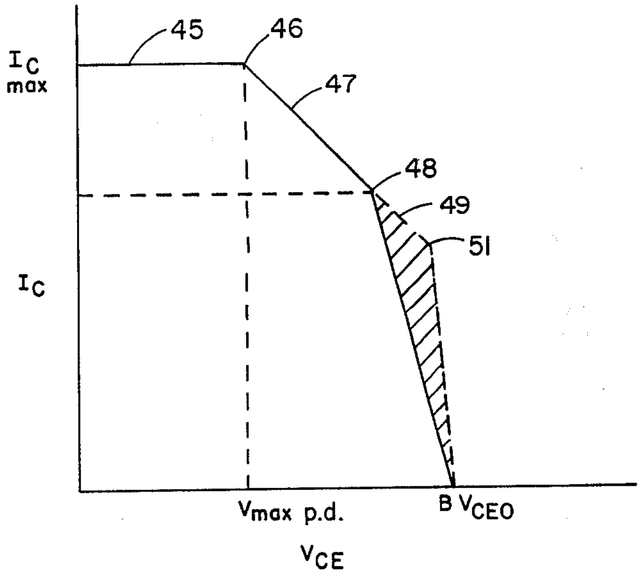
FIG. 8 is a generalized graph useful in explaining the nature of the invention.

Referring to FIG. 8 there is shown a plot of collector current against emitter collector voltage for devices of the nature according to the invention and as discussed in connection with the graphs of FIG. 9. The plot of FIG. 8 is very generalized in nature and is useful in explaining the advantages of the invention. Thus the device may operate with an arbitrarily assigned maximum current along a portion of the graph 45 to a point 46 which would represent the voltage at maximum power dissipation. The portion 47 of the graph then represents increasing voltage and decreasing current but constant wattage until a point 48 is reached. In devices according to the standard form when point 48 is reached there is a rapid drop from the emitter collector voltage to the collector emitter breakdown voltage $BV_{CEO}$. In devices according to the invention additional power may be obtained along the portion 49 of the curve until the point 51 is reached from which there is a rapid drop to the breakdown voltage.

Devices as described herein, while applicable generally to transistors of all power ratings, they have particular applicability to transistors of higher power ratings.

Figure 2:
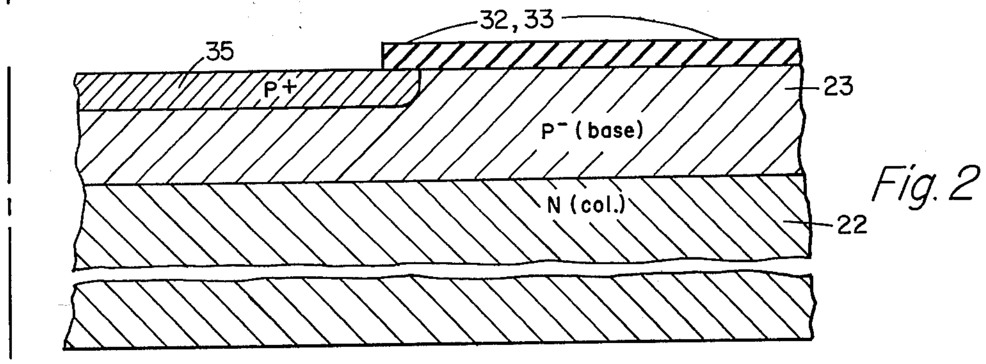
FIGS. 2, 3 and 4 are sectional views of successive steps in forming a device as illustrated in FIG. 1.
Figure 3:
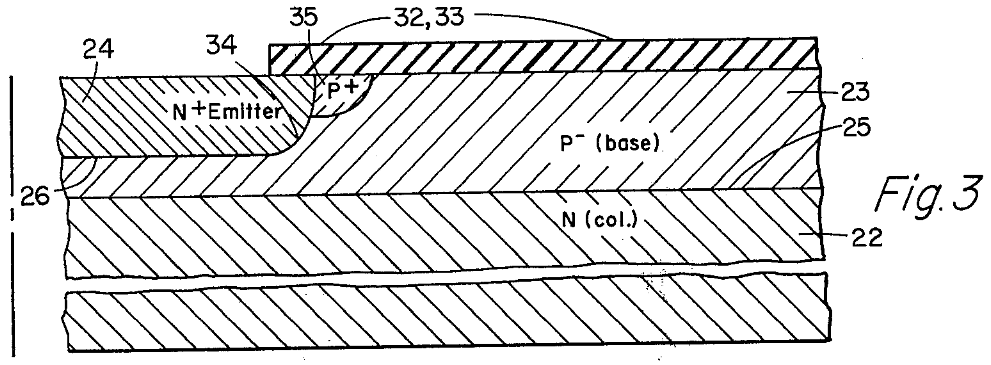
Figure 4:
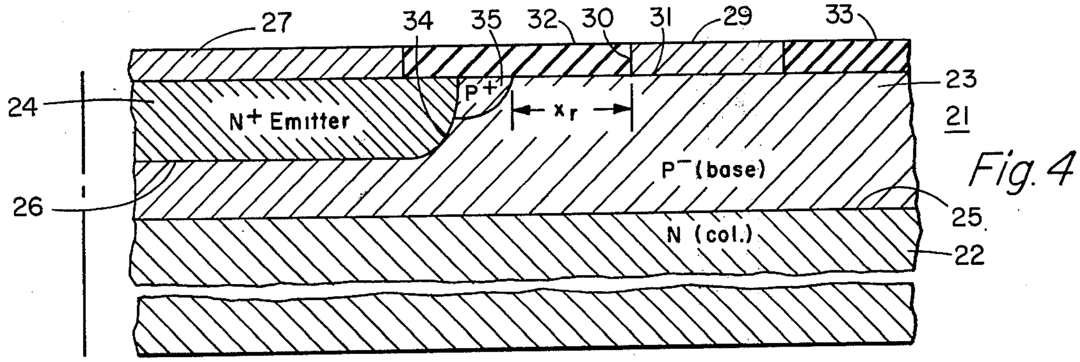

Referring to FIGS. 2, 3 and 4 there is shown a series of views representing different stages in the construction of the device illustrated in FIG. 1. In this series of figures an NPN device is described. The collector 22 of N material is not of particular significance with respect to the improvements of the invention. The collector typically may be the substrate upon which the transistor is formed and the portion 22 may consist of an N+ region on which an N− layer of 8–10 microns in thickness has been deposited epitaxially. The base 23 may be epitaxially deposited of P− material about one-half to 1 mil in thickness and having a sheet resistance of 800 or 2500 ohms per square typically. Depositing of the P− layer forms the PN junction 25. After depositing the P− base area 23 a layer of silicon dioxide 32 is deposited by well known techniques and is windowed by the usual photoresist techniques and a P+ diffusion 35 is made as shown in FIG. 2.

Thereafter a layer of silicon dioxide 32 is grown, or regrown, is windowed by the usual photoresist techniques and the N+ emitter 24 is diffused through the P+ layer 35 and into the P− base region to form the junction 26 already described. The P+ region 35 may have a diffusion depth of 0.5–1.5 microns and a resistivity of 100 to 400 ohm centimeters. The N+ emitter is diffused to be at solid solubility of the silicon and would have a surface concentration of the order of $10^{20}$ to $10^{22}$ atoms per cubic centimeter giving a resistivity of the order of 8–10 ohm centimeters. The emitter would be of the order of about 3 microns deep and the P+ region 35 would be shallower than the emitter by about one-half of a micron. As indicated previously, the radial extent of the P+ area 35 would be about 1 mil larger than the radius of the emitter. The dimensions given are typical figures giving the general area of the dimensions. Specific values may be selected by those skilled in the arts for particular devices.

As shown in FIG. 1 the device is symmetrical about a center line although this is not necessarily the case.

In FIG. 4 the device is shown following the process steps of FIG. 3. With further photoresist techniques, appropriate openings are formed in the silicon dioxide layer and metallic contacts 27 and 29 may be applied such as by vacuum deposition of aluminum. In FIG. 4 the device is shown broken along each edge to indicate that more than one similar device may be formed on a single substrate or wafer of semiconductor material, for example silicon.

Figure 5:
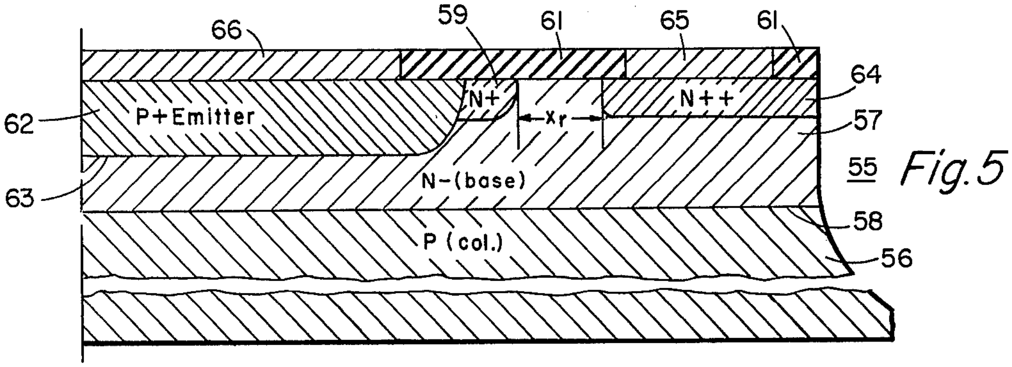
FIG. 5 is a sectional view, partially broken away, of a modified form of transistor according to the invention.

In FIG. 5 there is shown a PNP form of the invention designated by the reference character 55. In this case a P type collector 56 of silicon is utilized as the substrate and upon which an N− base layer 57 is epitaxially deposited forming a junction 58. An N+ layer 59 is diffused into the N− base area in a manner similar to the P+ layer 35 of the preceding figure. Thereafter by appropriate masking of a silicon dioxide layer 61 the P+ emitter 62 is diffused through the N+ layer 59 and into the N− base to form the junction 63. Also by photoresist techniques, an appropriate window is formed, and an N++ layer 64 is diffused into the N− base region in order that a metallization 65, for example, evaporated aluminum may be used as the contact to the base layer when forming an ohmic contact therewith. Similarly a metallic contact 66 is formed on the P+ emitter.

The distributed resistance $x_r$ exists between the periphery of N+ layer 59 and the inward edge of the N++ layer 64.

Figure 6:
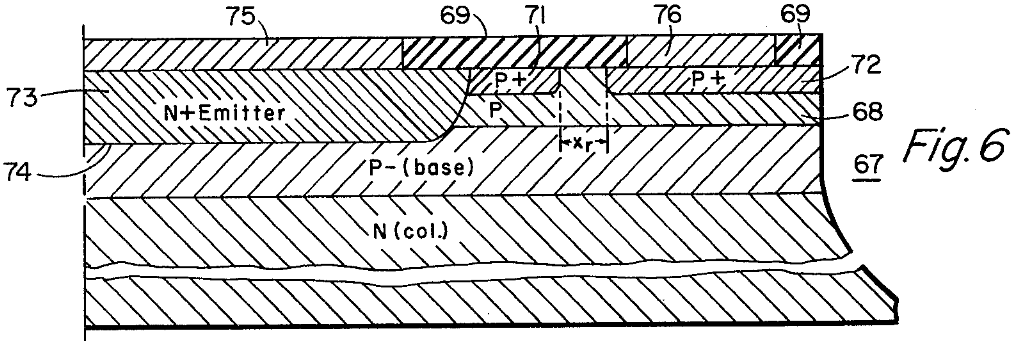
FIGS. 6 and 7 are sectional views of modified forms of transistors according to the invention.

FIG. 6 represents a further form of the invention which may be of the NPN type and is identified by the reference character 67. The form of the invention shown in FIG. 6 differs from that of FIG. 1 in that a P layer 68 is diffused into the P− base region and extends over the whole surface of the wafer. Thereafter by appropriate windowing of a silicon dioxide layer two P+ regions 71 and 72 are diffused into the P layer 68. The outward edge of the P+ layer 71 and the inward edge of the P+ layer 72 are spaced from each other and form with the P region 68 and the P− base region, the distributed resistance $x_r$ as shown. After the P+ regions 71 and 72 have been diffused the emitter 73 is diffused through the P+ layer 71, and the P layer 68 into the P− base region to form the NP emitter base junction 74. By appropriate use of photoresist techniques the contact metallization 75 to the emitter and 76 to the base are made. In the form of the invention illustrated in FIG. 6 the distributed resistance $x_r$ performs in the manner described in connection with FIG. 1.

Figure 7:
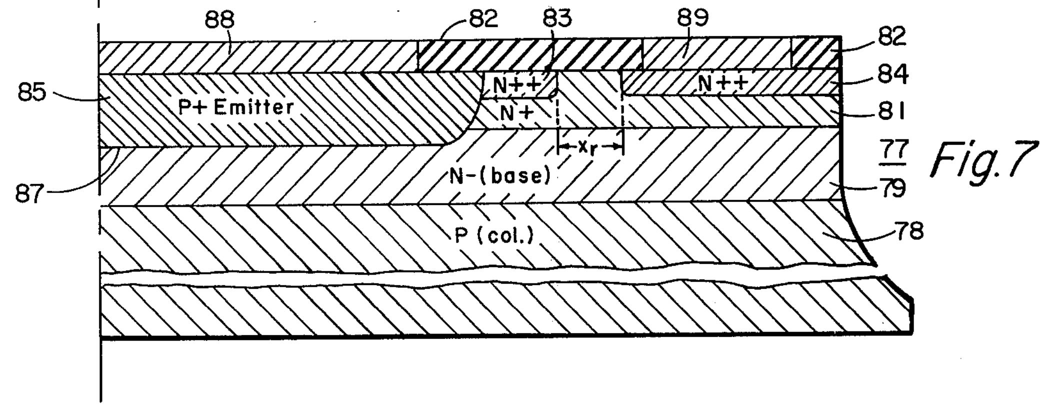

In FIG. 7 there is shown a form of a device, according to the invention, identified by the reference character 77 and is a PNP device of the same general nature as FIG. 6 is an NPN device. Thus in FIG. 7 there is a P type collector of silicon for example 78 upon which an N− base area 79 is epitaxially deposited. An N+ layer 81 is diffused into the N− base region and extends over the whole surface of the wafer. Thereafter, by suitable photoresist techniques, appropriate windows are opened in a silicon dioxide layer 82 and two N++ regions 83 and 84 are diffused into the N+ region 81. The outer edge of N++ region 83 and the inner edge of the N++ region 84 do not come together but have a space therebetween which defines the extent of the distributed resistance $x_r$ in the N+ region and in the N− region of the base. After the N++ regions 83 and 84 have been diffused a P+ emitter 85 is diffused through the N++ and N+ regions 83 and 81 respectively to form a junction 87 in the N− base region. Suitable windows are again opened by well known photoresist techniques and contact metallizations 88 and 89 are formed to the P+ emitter and the N++ region 84.

In the form of the invention shown in FIG. 7 the distributed resistance $x_r$ performs in the same manner as described in connection with the preceding figures in order to increase the safe operating area of a transistor so that additional wattage may be obtained without increasing the dimensions of the device, or correspondingly, if the dimensions are reduced the same wattage may be obtained. The presence of the distributed resistance $x_r$ forces the emitter base current to flow from increasing areas of the emitter rather than from the periphery immediately adjacent the base contact.

While in the foregoing description, various of the layers have been referred as being formed epitaxially, this is exemplary only and devices according to the invention may be of an all diffused construction.

I claim:

1. A transistor, which comprises:

a collector of one conductivity type, a base region of opposite conductivity type on said collector, said base region having an upper surface opposite to said collector, a region of enhanced conductivity of the same conductivity type as said base region extending from the upper surface of said base region into said base region to a given depth, having a given area and having a higher doping concentration than said base region, an emitter region of said one conductivity type contained within and smaller than the area of said enhanced conductivity region but having a greater depth than said enhanced conductivity region so as to extend beneath said enhanced conductivity region into said base region and leave a portion of said enhanced conductivity region surrounding said emitter reigon at said upper surface, and ohmic contact metallization over each of said emitter and base regions, the ohmic contact for said base region being spaced apart from said region of enhanced conductivity.

2. The transistor of claim 1 in which said transistor is a power transistor.

3. A transistor according to claim 1 wherein said enhanced conductivity region is a diffusion.

4. A transistor according to claim 1 wherein the emitter is of N+ conductivity type, the base is of P-conductivity type, and the collector is of N conductivity type.

5. A transistor according to claim 1 wherein the emitter is of N+ conductivity type, the base is of P-conductivity type, the collector is of N conductivity type and the enhanced conductivity region is of P+ conductivity type.

6. A transistor according to claim 1 wherein said emitter is an N+ diffusion into said base and said enhancement region is a P+ diffusion into said base.

7. A transistor according to claim 1 wherein said enhancement region is a P+ diffusion into said base and said emitter is an N+ diffusion into and through said enhancement region into said base.

8. A transistor according to claim 1 wherein the emitter is of P+ conductivity type, the base is of N-conductivity type, the collector is of P conductivity type and the enhanced conductivity region is of N+ conductivity type.

9. A transistor according to claim 1 wherein, said emitter is a P+ diffusion into said base and said enhancement region is an N+ diffusion into said base.

10. A transistor according to claim 1 wherein said enhancement region is an N+ diffusion into said base and said emitter is a P+ diffusion into and through said enhancement region into said base.

* * * * *